US008619912B2

(12) United States Patent
Hasegawa

(10) Patent No.: US 8,619,912 B2
(45) Date of Patent: Dec. 31, 2013

(54) FREQUENCY SHIFT CIRCUIT AND COMMUNICATION DEVICE

(75) Inventor: Tsuyoshi Hasegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 315 days.

(21) Appl. No.: 13/235,718

(22) Filed: Sep. 19, 2011

(65) Prior Publication Data
US 2012/0128100 A1    May 24, 2012

(30) Foreign Application Priority Data
Nov. 18, 2010    (JP) ................................. 2010-258319

(51) Int. Cl.
*H04L 27/00*    (2006.01)
*H04L 27/06*    (2006.01)
(52) U.S. Cl.
USPC ......................................... 375/316; 375/340
(58) Field of Classification Search
USPC ................................. 375/316, 340
See application file for complete search history.

(56) References Cited

U.S. PATENT DOCUMENTS

| 6,563,859 | B1 | 5/2003 | Oishi et al. | |
|---|---|---|---|---|
| 7,227,834 | B1 * | 6/2007 | Barton et al. | 370/208 |
| 2005/0164656 | A1 * | 7/2005 | Watabe et al. | 455/114.3 |
| 2006/0271611 | A1 * | 11/2006 | Kim et al. | 708/200 |
| 2009/0080554 | A1 * | 3/2009 | Dapper et al. | 375/260 |
| 2010/0035554 | A1 * | 2/2010 | Ba et al. | 455/63.1 |

FOREIGN PATENT DOCUMENTS

| JP | 07-221806 A | 8/1995 |
|---|---|---|
| JP | 2000-252866 A | 9/2000 |

* cited by examiner

*Primary Examiner* — Don N Vo
(74) *Attorney, Agent, or Firm* — Fujitsu Patent Center

(57) ABSTRACT

A frequency shift circuit that shifts the frequency of an input signal using a rotor corresponding to a predetermined phase rotation amount, the frequency shift circuit includes a table look-up unit that includes a plurality of tables that store complex data and outputs the complex data for each table based on address information, a complex multiplication circuit that complex-multiplies the complex data which have been output from the table look-up unit for each table, a deletion circuit that generates a rotor corresponding to a phase rotation amount which is based on a result of complex-multiplication executed, and a calculation circuit that calculates the address information for each table such that $\exp(2\pi j\theta)$ is obtained as the result of complex multiplication executed based on rotation angle information $\theta$.

8 Claims, 8 Drawing Sheets

FREQUENCY SHIFT CIRCUIT AND COMMUNICATION DEVICE

CROSS-REFERENCE TO RELATED APPLICATION

This application is based upon and claims the benefit of priority of the prior Japanese Patent Application No. 2010-258319, filed on Nov. 18, 2010, the entire contents of which are incorporated herein by reference.

FIELD

The embodiments discussed herein are related to a frequency shift circuit that obtains a rotor based on rotation angle information.

BACKGROUND

For example, as one of techniques of increasing a downlink communication speed, DC-HSDPA (Dual Cell-High Speed Downlink Packet Access) which is standardized by the 3GPP (Third Generation Partnership Project) which is an organization for standardization of manufactures is proposed. The DC-HSDPA is a technique of performing high-speed communication utilizing a communication system called HSPA (High Speed Packet Access). In the DC-HSDPA, two adjacent frequency bands (carriers) are simultaneously received using one terminal to double the transmission speed. Therefore, in a communication system adopting the DC-HSDPA, a terminal separates a received DC-HSDPA-based signal into signals having respective frequency bands by a predetermined method and performs a demodulating process on each of the frequency bands so separated.

As a predetermined method of separating such a DC-HSDPA-based signal as mentioned above using a terminal, for example, a method of receiving the DC-HSDPA-based signal using a single analog circuit, converting the signal into a digital signal and separating the A/D converted digital signal by digital signal processing is proposed. Specifically, first, the analog circuit performs a receiving process in a frequency band of 10 MHz and then converts the received analog signal to the digital signal. Then, a digital circuit separates the digital signal for two channels into respective signals by digital signal processing. For example, a frequency shift circuit which is disposed for each channel shifts (±2.5 MHz) the central frequency of the digital signal (10 MHz) for two channels and then a digital filter for each channel extracts only a desired frequency band (5 MHz) from the signal. Owing to execution of processing as mentioned above, it may become possible to separate the digital signal for two channels into channel-based signals.

Next, an existing frequency shift circuit which is used to separate a digital signal for two channels as mentioned above into channel-based signals will be described. For example, the existing frequency shift circuit generates a rotor ω which is a phase rotation amount by loop operation using a complex multiplier that inputs a complex exponential signal exp(j2πft) wherein t denotes a sampling period and a rotor in a previous sampling period. Then, the existing frequency shift circuit shifts the frequency by multiplying, for example, the digital signal for two channels by the rotor ω. Therefore, when a digital signal for two channels is to be separated as mentioned above, the frequency shift circuit for arithmetically operating the rotor ω may be disposed for each channel to perform frequency shifting using each circuit.

However, it is desirable for the above mentioned existing frequency shift circuit to set the rotor ω highly accurately. Specifically, in the above mentioned existing frequency shift circuit, for example, if the frequency of 2.5 MHz is shifted with an error of about 0.1 Hz, the accuracy of about 25 bits will be desirable for the rotor from the following formula (1). That is, in the existing frequency shift circuit, execution of complex multiplication of 25 bits may be desirable for each sample, which may cause such a problem that the throughput is increased.

$$\text{Log}_2(2500000/0.1)=24.6 \tag{1}$$

On the other hand, there exists a frequency shift circuit which is configured to solve the above mentioned problem by looking up the rotor ω from a table and not executing complex multiplication of 25 bits on each sample from several years ago. The above mentioned existing frequency shift circuit is configured to calculate only the angle with an accuracy of 25 bits and to store the rotor ω in a rotor table. The rotor needs only have the accuracy of the number of bits which is the same as that of, for example, an A/D converter and the accuracy may be set to 10 bits by way of example. In the above mentioned situation, the angle resolution will be 12 bits. That is, the above mentioned frequency shift circuit reduces the angle resolution of the angle θ which has been calculated with an accuracy of 25 bits to 12 bits and looks up a value exp(2πjθ) from a predetermined rotor table based on the above 12-bit angle information to output the 10-bit rotor ω. Owing to the above mentioned configuration, it may become possible not to perform complex multiplication of 25 bits on each sample in order to obtain the rotor ω. As a result, the throughput may be favorably reduced.

Japanese Laid-open Patent Publication No. 2000-252866 and Japanese Laid-open Patent Publication No. 7-221806 are examples of related art.

SUMMARY

According to an aspect of the embodiments, a frequency shift circuit that shifts the frequency of an input signal using a rotor corresponding to a predetermined phase rotation amount, the frequency shift circuit includes a table look-up unit that includes a plurality of tables that store complex data and outputs the complex data for each table based on address information, a complex multiplication circuit that complex-multiplies the complex data which have been output from the table look-up unit for each table, a deletion circuit that generates a rotor corresponding to a phase rotation amount which is based on a result of complex-multiplication executed, and a calculation circuit that calculates the address information for each table such that exp(2πjθ) is obtained as the result of complex multiplication executed based on rotation angle information θ.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the above mentioned existing frequency shift circuit using the rotor table according to related art, for example, a rotor table of $2^{12} \times 10$ bits (4096×10 bits) may be used for each of an I channel and a Q channel. That is, in the above mentioned existing frequency shift circuit, it may be unavoidable to prepare a relatively large table and hence room for further improvement may be left from a viewpoint of downsizing of the circuit scale.

Accordingly, embodiments aim to provide a frequency shift circuit that may implement frequency shifting with a smallest possible circuit scale.

In the following, preferred embodiments of a frequency shift circuit and a communication device that the present invention discloses will be described in detail with reference to the accompanying drawings. Incidentally, the present invention is not limited by the embodiments.

Embodiment 1

Figure 1:
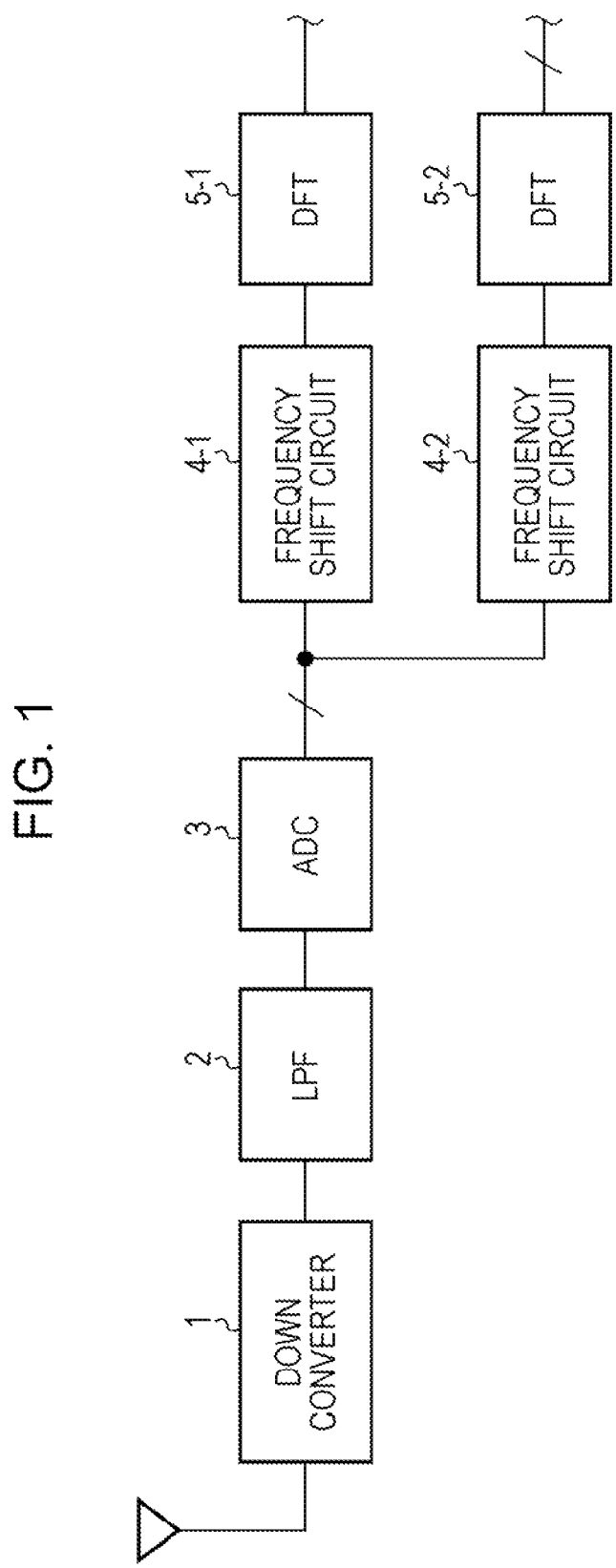
FIG. 1 is a diagram illustrating an example of a configuration of a communication device including a frequency shift circuit according to an embodiment 1.

FIG. 1 is a diagram illustrating an example of a configuration of a communication device including a frequency shift circuit according to an embodiment 1. The communication device includes a down converter 1, an LPF (an analog filter) 2, an ADC (an A/D converter) 3, frequency shift circuits 4-1 and 4-2, and DTFs (digital filters) 5-1 and 5-2. The frequency shift circuits 4-1 and 4-2 may be implemented as one or more processors, e.g., Digital Signal Processor (DSP). In the embodiment 1, the communication device receives a DC-HSDPA-based signal which is standardized by, for example, the 3GPP which is an organization for standardization of manufactures of W-CDMA system. In the DC-HSDPA, the transmission speed is doubled by simultaneously receiving two adjacent frequency bands (5 MHz-wide×2) using one terminal (corresponding to the above mentioned communication device). Therefore, in the above communication device, the received DC-HSDPA-based signal is separated into signals having respective frequency bands by a predetermined method and a demodulating process is performed on each of the frequency bands so separated.

Next, the operation of the communication device according to the embodiment 1 will be described. In the communication device according to the embodiment 1, for example, a DC-HSDPA-based signal is received using a single analog circuit, the analog signal is converted to a digital signal and the A/D converted digital signal is separated by digital signal processing. Specifically, first, in the analog circuit, the down converter 1 down-converts the frequency of the received signal to a desired frequency, and then the LPF 2 filters a desired frequency band of 10 MHz out of the down-converted signal and outputs the filtered-out signal to the ADC 3. Then, the ADC 3 converts the received analog signal to the digital signal, for example, with an accuracy of 10 bits. Then, in a digital circuit, the digital signal for two channels is separated into signals for respective channels by digital signal processing. For example, each of the frequency shift circuits 4-1 and 4-2 which are disposed for respective channels shifts the central frequency of the digital signal (10 MHz) for two channels to each desired frequency (±2.5 MHz). Then, the DTFs 5-1 and 5-2 for respective channels respectively extract the desired bands (5 MHz-wide).

In the embodiment 1, for example, when a digital signal for two channels is to be separated as described above, the frequency shift circuits 4-1 and 4-2, each being configured to arithmetically operate the rotor ω which is a phase rotation amount corresponding to a frequency shift amount, are disposed for respective channels so as to individually perform frequency shifting using these circuits.

Figure 2:
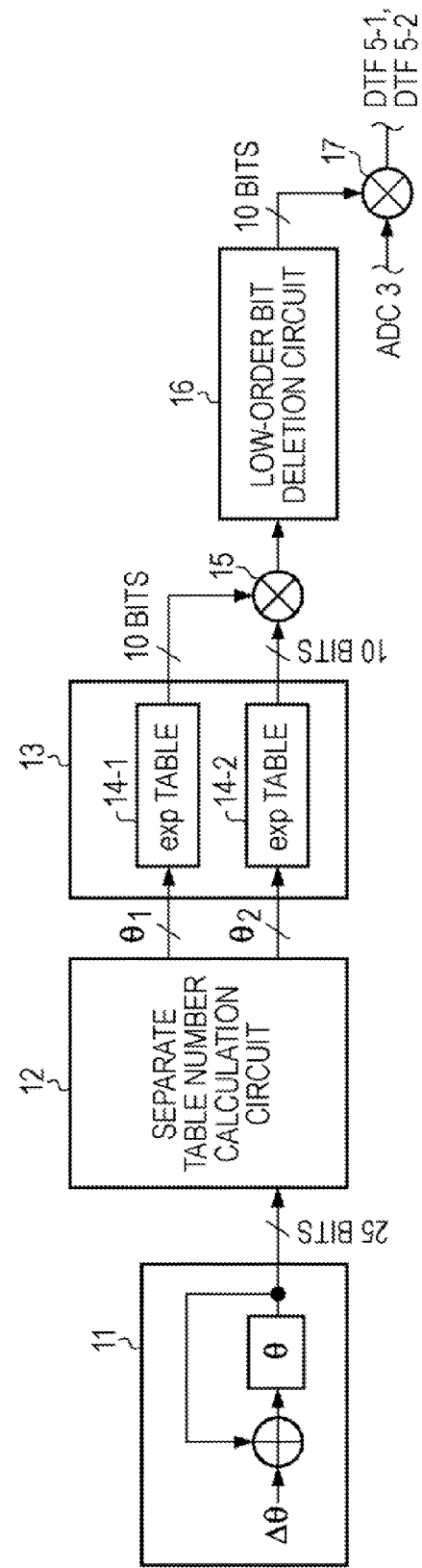
FIG. 2 is a diagram illustrating an example of a configuration of a frequency shift circuit according to the embodiment 1.

Next, the frequency shift circuit (4-1 or 4-2) included in the above communication device will be described. FIG. 2 is a diagram illustrating an example of a configuration of the frequency shift circuit according to the embodiment 1. In the example illustrated in FIG. 2, the frequency shift circuit according to the embodiment 1 includes an angle computing unit 11, a separate table number calculation circuit 12, a table look-up unit 13, a complex multiplication circuit 15, a low-order bit deletion unit 16, and a complex multiplication circuit 17. In addition, the table look-up unit 13 includes exp tables 14-1 and 14-2. Incidentally, it is supposed that the frequency shift circuit 4-1 has the same configuration as the frequency shift circuit 4-2. In the following, description will be made using the frequency shift circuit 4-1 for the convenience of explanation.

In the frequency shift circuit 4-1, the angle computing unit 11 has a configuration including an adder that performs, for example, clipless addition of unsigned 25 bits and computes the rotation angle information θ with an accuracy of 25 bits. The adder performs loop operation that adds a fixed value (angle) Δθ to fed-back rotation angle information for every symbol. For example, when the rotation angle information is a 4-bit digital signal, a numerical value 10000 corresponds to an angle of 360 degrees. In the above adder, at a moment that the value has exceeded 1111, it is automatically reduced to a value 0000 which is obtained by subtracting 10000 (360 degrees). Thus, execution of so-called mod operation may be eliminated. The angle computing unit 11 outputs 25-bit rotation angle information θ which is updated for every symbol as a result of loop operation executed using an adder as mentioned above.

The separate table number calculation circuit 12 calculates separate table numbers $\theta_1, \theta_2, \ldots,$ and $\theta_n$ corresponding to addresses of respective exp tables based on the 25-bit rotation angle information θ that the angle computing unit 11 outputs. In the example in FIG. 2, the separate table numbers $\theta_1, \theta_2, \ldots,$ and $\theta_n$ are calculated from the rotation angle information θ such that exp(2πjθ) may be obtained as the complex-multiplied value of an output from each exp table. Therefore, it is supposed that the separate table numbers $\theta_1, \theta_2, \ldots,$ and $\theta_n$ satisfy the following formula (2). In the formula, δ indicates an error in rotation angle and a value which is smaller than a value desirable as the accuracy of the rotor is set as δ.

$$\theta = \theta_1 + \theta_2 + \ldots + \theta_n + \delta \quad (2)$$

Owing to calculation of the above formula, it may become possible to make the complex-multiplied value which is output from multiplication unit almost equal to $\exp(2\pi j\theta)$. In the embodiment 1, a case in which the separate table numbers are $\theta_1$ and $\theta_2$ will be described as follows by way of example.

The table look-up unit 13 extracts data (complex data) corresponding to the separate table numbers from the exp tables 14-1 and 14-2 by looking-up the tables. In the exp tables 14-1 and 14-2, data (for example, 10-bit information) that respectively correspond to the separate table numbers $\theta_1$ and $\theta_2$ and with which $\exp(2\pi j\theta)$ may be obtained as the complex-multiplied values of outputs from the values stored in respective tables.

Figure 3:
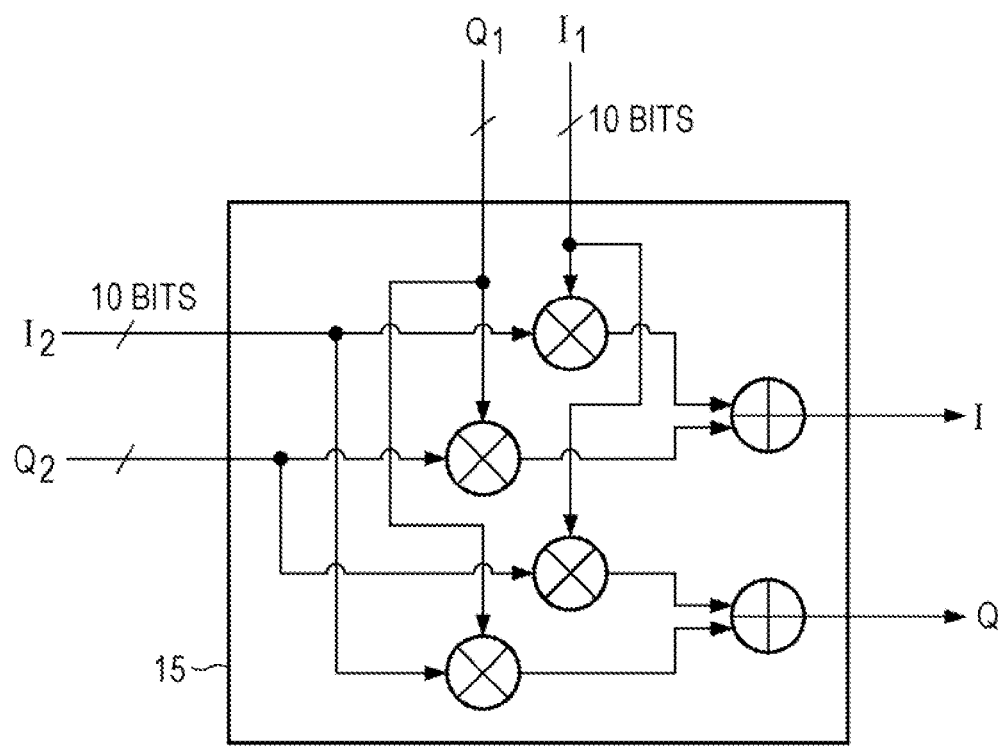
FIG. 3 is a diagram illustrating an example of a detailed configuration of a complex multiplication circuit.

The complex multiplication circuit 15 complex-multiplies the outputs (10 bits) from the respective tables to output the complex-multiplied value $\exp(2\pi j\theta)$. FIG. 3 is a diagram illustrating an example of a detailed configuration of the complex multiplication circuit 15. The complex multiplication circuit 15 multiplies a real part ($I_1$) of the output from the exp table 14-1 and a real part ($I_2$) of the output from the exp table 14-2, multiplies an imaginary part ($Q_1$) of the output from the exp table 14-1 and an imaginary part ($Q_2$) of the output from the exp table 14-2, and subtract results of respective multiplications executed. Simultaneously with execution of the above multiplications, the complex multiplication circuit 15 multiplies the real part ($I_1$) of the output from the exp table 14-1 and the imaginary part ($Q_2$) of the output from the exp table 14-2, multiplies the real part ($I_2$) of the output from the exp table 14-2 and the imaginary part ($Q_1$) of the output from the exp table 14-1, and adds together results of multiplications executed. As a result, a real part (I) and an imaginary part (Q) of the complex-multiplied value $\exp(2\pi j\theta)$ may be obtained.

The low-order bit deletion unit 16 deletes surplus bits from the complex-multiplied value $\exp(2\pi j\theta)$ to generate the rotor $\omega$. The rotor needs only have an accuracy of the number of bits which is almost the same as that of the ADC 3 and here it is supposed that it has an accuracy of 10 bits by way of example. In the embodiment 1, the low-order bit deletion unit 16 executes a process of reserving 10 bits by deleting low-order bits from the complex-multiplied value $\exp(2\pi j\theta)$.

The complex multiplication circuit 17 performs frequency shifting by multiplying, for example, the digital signal for two channels that the ADC 3 outputs by the rotor $\omega$ that the low-order bit deletion unit 16 has generated.

In the following, an example of a process executed using the divided table number calculation circuit 12 will be specifically described. Incidentally, although in the embodiment 1, an example in which the rotation angle information for one period is expressed in the form of $\theta = 0, 1, \ldots,$ and 255 and $\delta = 0$ will be described for the convenience of explanation, the present invention is not limited thereto.

In the above mentioned situation, if it is intended to obtain the value $\exp(2\pi j\theta)$ from one table as in related art, 256 pieces of information corresponding to the number of values of the rotation angle information $\theta$ will be held in the table. On the other hand, in the embodiment 1, the table is separated into two tables (corresponding to the exp tables 14-1 and 14-2), for example, as illustrated in FIG. 2. Specifically, the table is separated into the exp table 14-1 out of which data corresponding to every fifth $\theta_1$ ($\theta_1 = 0, 5, 10, \ldots,$ and 255) may be taken and the exp table 14-2 out of which data corresponding to $\theta_2$ ($\theta_2 = 0, 1, 2, \ldots,$ and 10) may be taken. That is, data corresponding to roughly set rotation angles are stored in the exp table 14-1 and data corresponding to rotation angles (small rotation angles) which are set more finely than the angles stored in the exp table 14-1 are stored in the exp table 14-2. Then, the separate table number calculation circuit 12 selects and outputs $\theta_1$ and $\theta_2$ that satisfy a relation $\theta = \theta_1 + \theta_2$ for an arbitrary $\theta$ such that $\exp(2\pi j\theta)$ may be obtained as the complex-multiplied value of the output from each exp table. For example, when $\exp(2\pi j\theta)$ corresponding to $\theta = 22$ is to be looked up from the tables, the separate table number calculation circuit 12 selects and outputs "$\theta_1 = 20, \theta_2 = 2$" or "$\theta_1 = 15, \theta_2 = 7$" as a combination of $\theta_1$ with $\theta_2$. The total number of pieces of information to be stored in the tables may be reduced to "52+11=63" in the embodiment 1 by configuring the tables as mentioned above and the information amount may be reduced as compared with the total number of pieces of information (256 pieces) obtained when one table is used.

As described above, in the embodiment 1, the exp table used to obtain the rotor $\omega$ is separated into a plurality of tables and the separate table numbers $\theta_1, \theta_2, \ldots,$ and $\theta_n$ are calculated from the rotation angle information $\theta$ such that $\exp(2\pi j\theta)$ may be obtained as the complex-multiplied value of the output from each exp table. Then, the rotor $\omega$ is generated based on the complex-multiplied value $\exp(2\pi j\theta)$ of the output from each exp table. Since the amount of information stored in the exp tables may be reduced and the capacity of each table may be also reduced owing to the above mentioned configuration, frequency shifting may be implemented using a circuit of a scale which is smaller than that of an existing frequency shift circuit.

Embodiment 2

Figure 4:
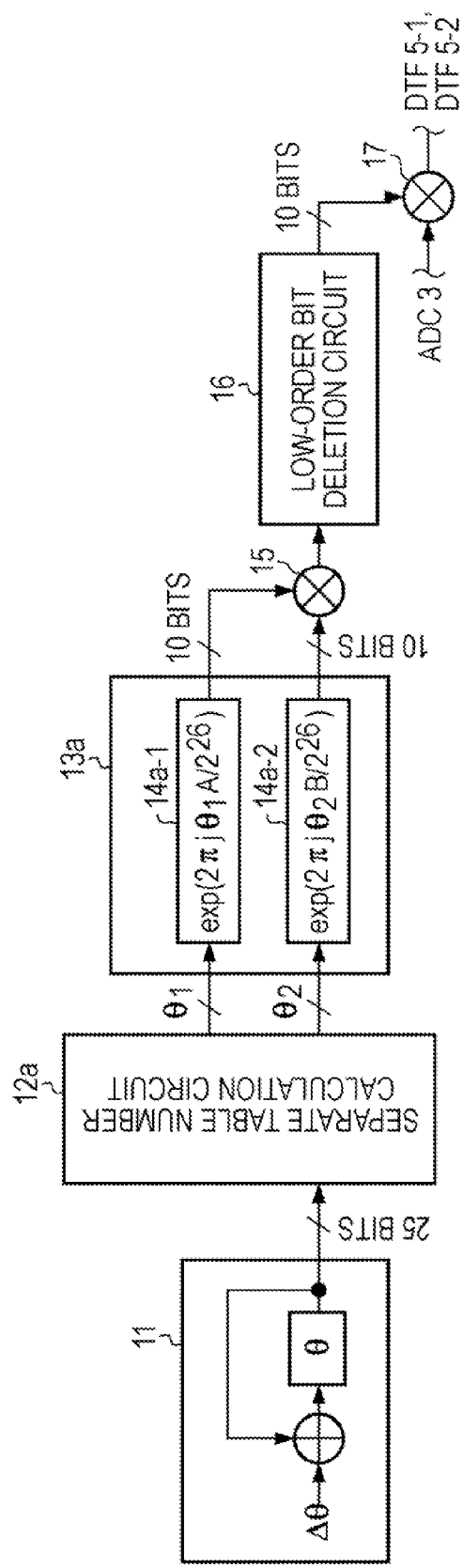
FIG. 4 is a diagram illustrating an example of a configuration of a frequency shift circuit according to an embodiment 2.

FIG. 4 is a diagram illustrating an example of a configuration of a frequency shift circuit according to an embodiment 2. In the example illustrated in FIG. 4, the same numerals are assigned to the same configurations as those in FIG. 2 of the above mentioned embodiment 1 and explanation thereof will be omitted. In addition, a communication device according to the embodiment 2 is different from the device according to the embodiment 1 in FIG. 1 only in the internal configuration of the frequency shift circuit and configurations other than the above are the same as those in the device in FIG. 1. Further, the internal configuration of the complex multiplication circuit 15 is the same as that according to the embodiment 1 illustrated in FIG. 3. In the explanation of the embodiment 2, only configurations and operations which are different from those in the embodiment 1 will be described.

In the embodiment 1, in some cases, when the separate table numbers $\theta_1$ and $\theta_2$ are selected, there exist a plurality of combinations of the table numbers (for example, when $\theta = 22$, the combinations "$\theta_1 = 20, \theta_2 = 2$" and "$\theta_1 = 15, \theta_2 = 7$" are obtained). Therefore, in the embodiment 2, the exp tables are effectively prepared so as to obtain a single combination of $\theta_1$ with $\theta_2$. As a result, frequency shifting may be implemented with a further smaller circuit scale.

A separate table number calculation circuit 12a of the frequency shift circuit according to the embodiment 2 obtains the separate table numbers $\theta_1$ and $\theta_2$ from the following formulae (3) and (4). In the formulae, it is supposed that A and B are natural numbers and satisfy a relation "A>B". In addition, floor is a function used to obtain a maximum integer not exceeding an argument (which is equivalent to discard of fractions below a decimal point in a positive integer).

$$\theta_1 = \text{floor}(\theta/A) \qquad (3)$$

$$\theta_2 = \text{floor}((\theta \bmod A)/B) \qquad (4)$$

That is, the separate table number calculation circuit 12a according to the embodiment 2 calculates the formulae (3) and (4) for an arbitrary $\theta$ such that $\exp(2\pi j\theta)$ may be obtained as the complex-multiplied value of the output from each exp table and outputs $\theta_1$ and $\theta_2$ that satisfy a relation $\theta = A\theta_1 + B\theta_2 + \delta$. Incidentally, a maximum value of $\delta$ reaches "B−1".

Here, an example of a process executed using the separate table number calculation circuit 12a will be specifically described. For example, if A=5 and B=1 under the same condition ($\theta$=0, 1, . . . , and 255, $\delta$=0) as in the embodiment 1 and the separate table number calculation circuit 12a executes calculation of the formulae (3) and (4), $\theta_1$ will be "0, 1, 2, . . . , and 51" and $\theta_2$ will be "1, 2, 3, 4". Therefore, for example, if the value exp($2\pi j\theta$) corresponding to $\theta$=22 is calculated, the separate table number calculation circuit 12a will output 4 as $\theta_1$ ($\theta_1$=4(A$\theta_1$=20)) and 2 as $\theta_2$($\theta_2$=2 (B$\theta_2$=2)). That is, the number of combinations of $\theta_1$ with $\theta_2$ is reduced to one.

In addition, a table look-up unit 13a extracts data (complex data) corresponding to the separate table numbers from exp tables 14a-1 and 14a-2 by looking up the tables. Data (for example, 10-bit information) that respectively correspond to the separate table numbers $\theta_1$ and $\theta_2$ and with which exp ($2\pi j\theta$) may be obtained as the complex-multiplied value of the output from each table are respectively stored in the exp tables 14a-1 and 14a-2. Specifically, data exp($2\pi j\theta_1 A/2^{26}$) corresponding to the rotation angle information A$\theta_1$ is stored in the exp table 14a-1 and data exp($2\pi j\theta_2 B/2^{26}$) corresponding to the rotation angle information B$\theta_2$ is stored in the exp table 14a-2. That is, values corresponding to the roughly set rotation angles are stored in the exp table 14a-1 and values corresponding to rotation angles (small rotation angles) which are set more finely than those in the exp table 14a-1 are stored in the exp table 14a-2.

As described above, in the embodiment 2, the separate table number calculation circuit 12a is configured to execute calculation of the formulae (3) and (4). Owing to the above mentioned configuration, since the number of combinations of $\theta_1$ with $\theta_2$ is reduced to one and the exp tables may be effectively prepared, it may become possible to implement frequency shifting with a circuit scale which is further smaller than that in the embodiment 1.

Embodiment 3

Figure 5:
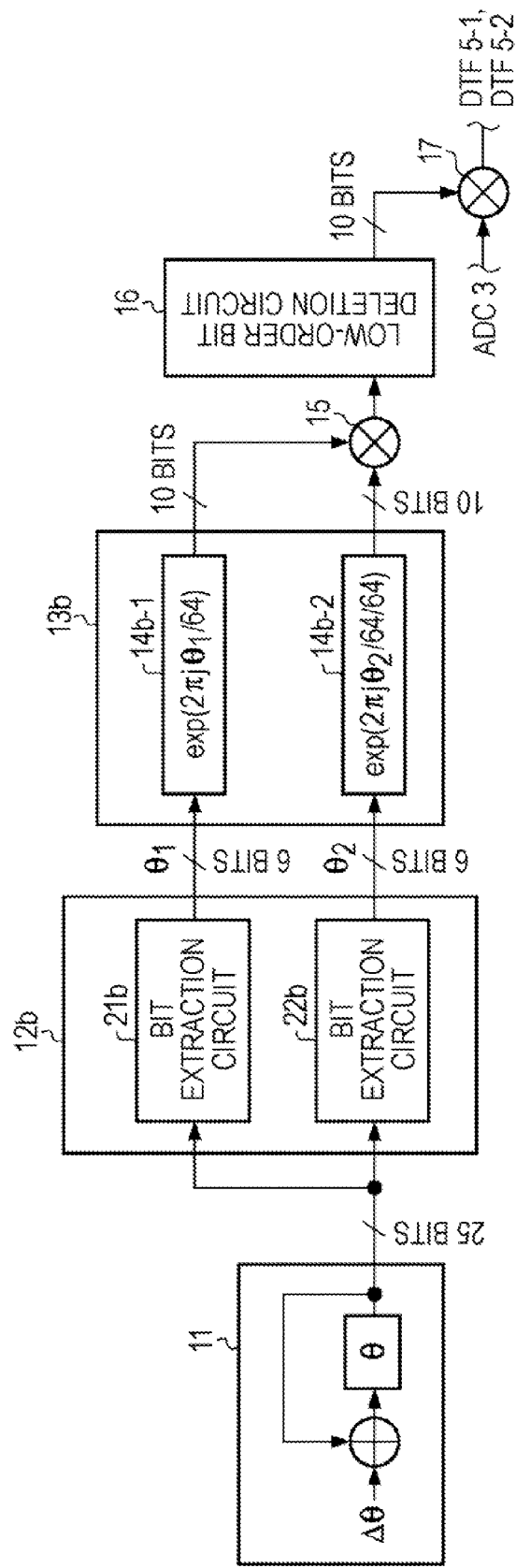
FIG. 5 is a diagram illustrating an example of a configuration of a frequency shift circuit according to an embodiment 3.

FIG. 5 is a diagram illustrating an example of a configuration of a frequency shift circuit according to an embodiment 3. In the example illustrated in FIG. 5, the same numerals are assigned to the same configurations as those in FIG. 2 according to the embodiment 1 or in FIG. 4 according to the embodiment 2 and explanation thereof will be omitted. In addition, a communication device according to the embodiment 3 is different from the device according to the embodiment 1 in FIG. 1 only in the internal configuration of the frequency shift circuit and configurations other than the above are the same as those in FIG. 1. Further, the internal configuration of the complex multiplication circuit 15 is the same as that according to the embodiment 1 illustrated in FIG. 3. In the explanation of the embodiment 3, only configurations and operations which are different from those in the embodiments 1 and 2 will be described.

In the embodiment 3, a digital value corresponding to the rotation angle information $\theta$ is partitioned in units of desired number of bits to generate the separate table numbers $\theta_1$ and $\theta_2$. Owing to the above mentioned configuration, arithmetic processing to be executed on the above formulae (3) and (4) may be eliminated and hence a circuit configuration may be more simplified.

For example, when 6-bit separate table numbers $\theta_1$ and $\theta_2$ are to be generated, in a separate table number calculation circuit 12b, a bit extraction unit 21b extracts high-order 6 bits from 25-bit rotation angle information $\theta$ (an arbitrary $\theta$) and outputs the extracted 6-bit signal as the separate table number $\theta_1$. The 6-bit separate table number $\theta_1$ has a value corresponding to each of the "roughly set rotation angles". In addition, in the separate table number calculation circuit 12b, a bit extraction unit 22b extracts the next 6 bits that come after the above high-order 6 bits from the 25-bit rotation angle information $\theta$ and outputs the extracted 6-bit signal as the separate table number $\theta_2$. The 6-bit separate table number $\theta_2$ has a value corresponding to each of the rotation angles (the small rotation angles) which are set more finely than the above "roughly set rotation angles". These processes are equivalent to those executed when A in the formulae (3) and (4) is $2^{19}$ and B in the formula (4) is $2^{13}$. Incidentally, in the embodiment 3, although a case in which the separate table numbers $\theta_1$ and $\theta_2$ are respectively 6-bit values has been described by way of example, the present invention is not limited to it and the separate table number of the arbitrary number of bits may be extracted.

In addition, a table look-up unit 13b extracts data (complex data) corresponding to the separate table numbers from exp tables 14b-1 and 14b-2 by looking up the tables. Data (for example, 10-bit information) that respectively correspond to the separate table numbers $\theta_1$ and $\theta_2$ and with which exp ($2\pi j\theta$) may be obtained as the complex-multiplied value of the output from each table are respectively stored in the exp tables 14b-1 and 14b-2. Specifically, data exp($2\pi j\theta_1/2^6$) corresponding to the separate table number $\theta 1$ is stored in the exp table 14b-1 and data exp($2\pi j\theta_2/2^6/2^6$) corresponding to the separate table number $\theta_2$ is stored in the exp table 14b-2. That is, values corresponding to roughly set rotation angles are stored in the exp table 14b-1 and values corresponding to small rotation angles are stored in the exp table 14b-2.

As described above, in the embodiment 3, the separate table number calculation circuit 12b is configured to extract the desired number of bits from an arbitrary $\theta$ to generate the separate table numbers $\theta_1$ and $\theta_2$ with no execution of calculation of the above mentioned formulae (3) and (4). Owing to the above mentioned configuration, since the exp tables may be prepared more effectively than in the embodiment 2, it may become possible to implement frequency shifting with a further smaller circuit scale. In addition, owing to the configuration that calculation of the formulae (3) and (4) is not executed, the amount of operations may be more reduced than in the embodiment 2.

Incidentally, although in the embodiment 3, the desired number of bits is extracted in order starting from higher-order bits as a method of extracting the desired number of bits from an arbitrary $\theta$, the present invention is not limited thereto and the same effect may be obtained, for example, by a method of extracting odd-numbered bits and even-numbered bits.

Embodiment 4

Figure 6:
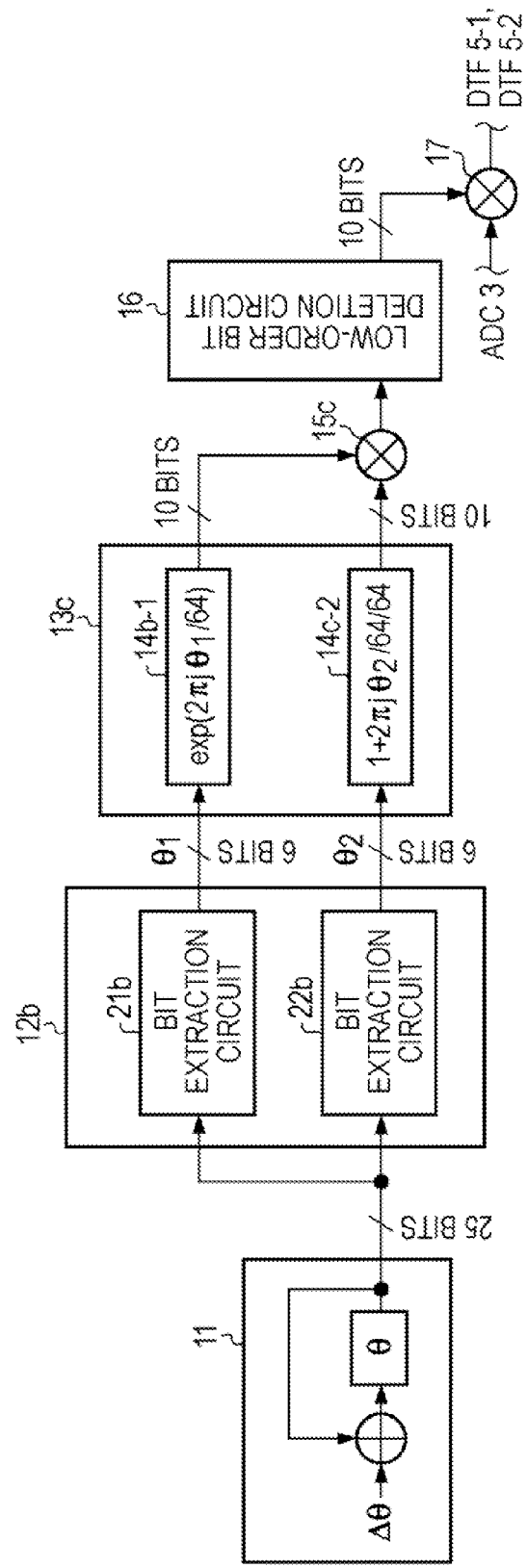
FIG. 6 is a diagram illustrating an example of a configuration of a frequency shift circuit according to an embodiment 4.

FIG. 6 is a diagram illustrating an example of a configuration of a frequency shift circuit according to an embodiment 4. In the example illustrated in FIG. 6, the same numerals are assigned to the same configurations as those in FIG. 5 of the above mentioned embodiment 3 and explanation thereof will be omitted. In addition, a communication device according to the embodiment 4 is different from the device according to the embodiment 1 in FIG. 1 only in the internal configuration of the frequency shift circuit and configurations other than the above are the same as those in FIG. 1. In the explanation of the embodiment 4, only configurations and operations which are different from those in the embodiment 3 will be described.

In the embodiment 3, although the data $\exp(2\pi j\theta_2/2^6/2^6)$ corresponding to the separate table number $\theta_2$ is stored in the exp table 14b-2, when the above "small rotation angles" are sufficiently small, the table size of the exp table 14b-2 may be reduced. Specifically, the real part of the value of the data "$\exp(2\pi j\theta_2/2^6/2^6)$" corresponding to the small rotation angle may be set to "1" by approximation. Thus, the frequency shift circuit according to the embodiment 4 is configured such that a table look-up unit 13c is disposed in place of the table look-up unit 13b and an exp table 14c-2 is disposed in place of the exp table 14b-2. Data "$(2+2\pi j\theta_2/64/64)$" is stored into the exp table 14c-2. Owing to the above mentioned configuration, since the information amount may be reduced to one-half (the real part may be eliminated) the information amount in the embodiment 3, the table size may be reduced to one-half accordingly.

Figure 7:
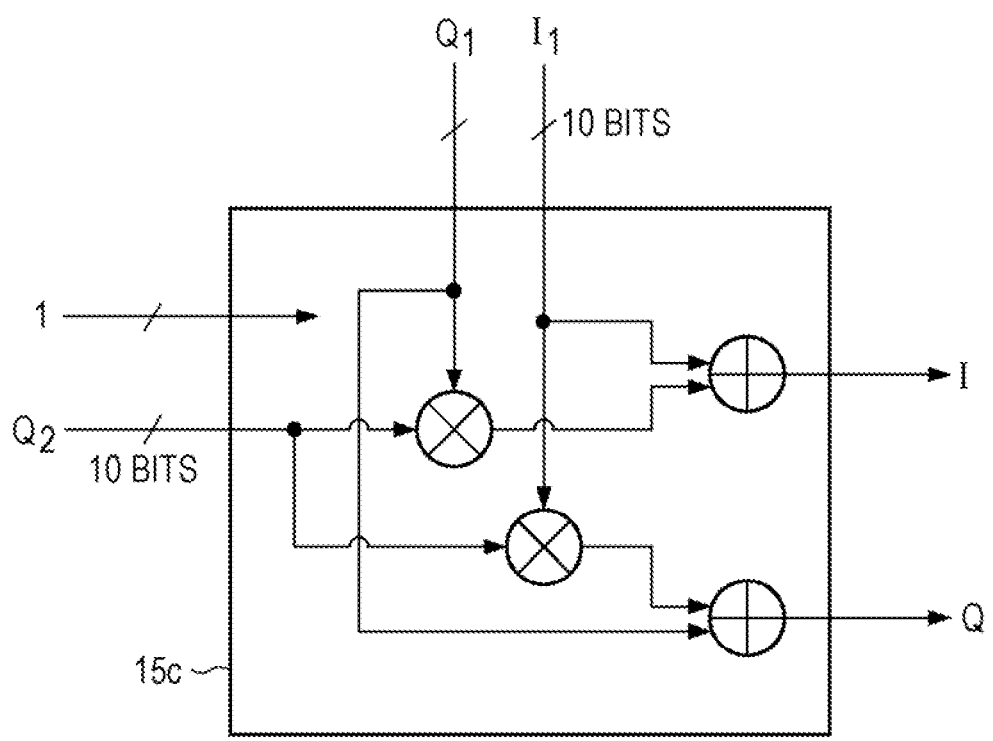
FIG. 7 is a diagram illustrating an example of a detailed configuration of a complex multiplication circuit.

In addition, since the real part of the value of the data "$\exp(2\pi j\theta_2/2^6/2^6)$" corresponding to the small rotation angle is set to "1" by the approximation, it may become also possible to reduce the circuit scale of the complex multiplication circuit in the embodiment 4. FIG. 7 is a diagram illustrating an example of a detailed configuration of a complex multiplication circuit 15c. The complex multiplication circuit 15c according to the embodiment 4 multiplies the imaginary part ($Q_1$) of the output from the exp table 14b-1 and the imaginary part ($Q_2$) of an output from the exp table 14c-2 and adds a result of multiplication executed to the real part ($I_1$) of the output from the exp table 14b-1. Simultaneously with execution of the above multiplication and addition, the complex multiplication circuit 15c multiplies the real part ($I_1$) of the output from the exp table 14b-1 and the imaginary part ($Q_2$) of the output from the exp table 14c-2 and then adds a result of multiplication executed to the imaginary part ($Q_1$) of the output from the exp table 14b-1. As a result, the real part (I) and the imaginary part (Q) of the complex-multiplied value $\exp(2\pi j\theta)$ are obtained. As described above, in the embodiment 4, the number of multipliers may be reduced to one-half the number of multipliers in the complex multiplication circuit 15 by the approximation.

As described above, in the embodiment 4, the real part of a value of data exp(•) corresponding to a small rotation angle is set to "1" by the approximation. As a result, the information amount may be greatly reduced and hence frequency shifting may be implemented with a circuit scale which is further smaller than that in the embodiment 3.

In addition, although it is configured that the data "$(1+2\pi j\theta_2/64/64)$" is stored in the exp table 14c-2 in the embodiment 4, small values are arrayed in the imaginary part of this data and hence higher-order bits may be deleted (for example, the number of bits may be reduced from 10 to 5). Incidentally, in the embodiment 4, the number of bits of the imaginary part $Q_2$ in the example in FIG. 7 is reduced to 5. Owing to bit reduction, the table size of the exp table 14c-2 may be further reduced. In addition, it may become possible to reduce the circuit scale of the complex multiplication circuit 15c owing to deletion of the higher-order bits in the output from the exp table 14c-2.

Incidentally, although the frequency shift circuit according to the embodiment 4 is configured such that the real part of the data exp(•) which is stored in the exp table 14b-2 according to the embodiment 3 is set to "1" by approximation, the approximation is not applied limitedly to the embodiment 4 and may be applicable to the embodiments 1 and 2 as long as the small rotation angle is sufficiently small. In addition, when the above approximation is applied, the process of deleting the high-order bits of the imaginary part of the data "$(1+2\pi j\theta_2/64/64)$" may be also applicable to the embodiments 1 and 2.

Embodiment 5

Figure 8:
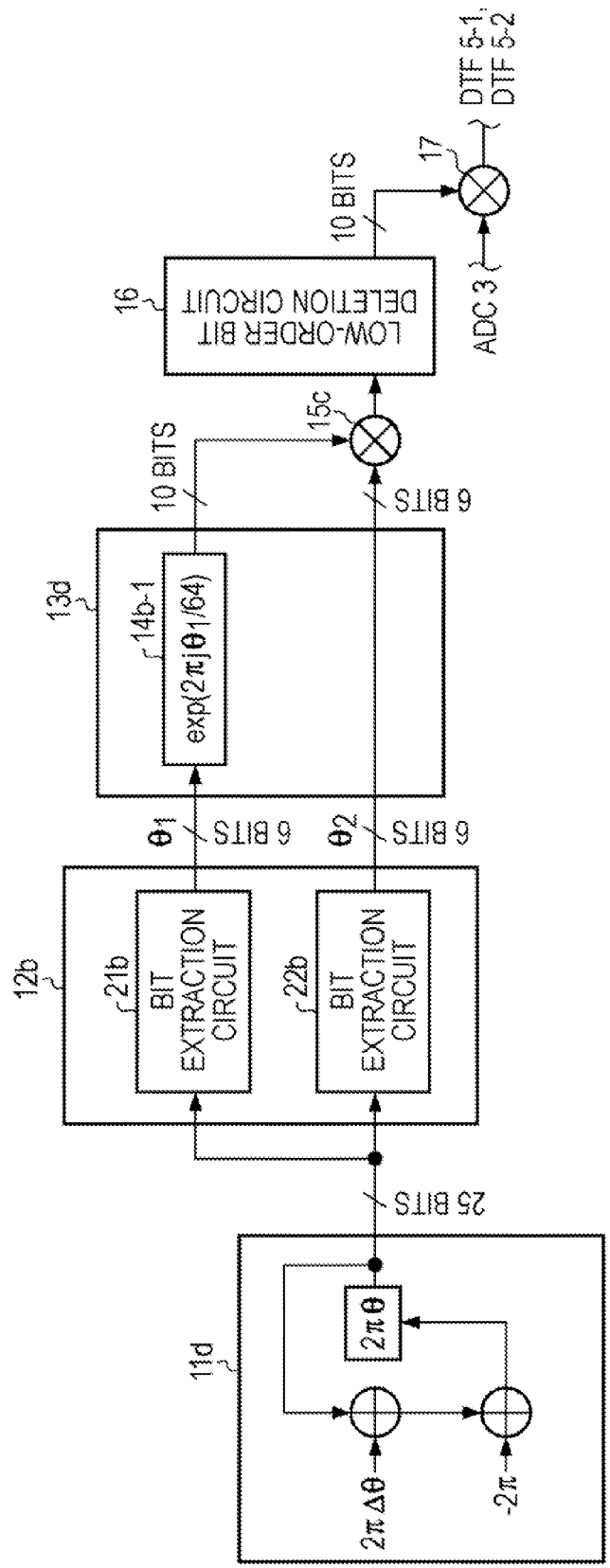
FIG. 8 is a diagram illustrating an example of a configuration of a frequency shift circuit according to an embodiment 5.

FIG. 8 is a diagram illustrating an example of a configuration of a frequency shift circuit according to an embodiment 5. In the example illustrated in FIG. 8, the same numerals are assigned to the same configurations as those in FIG. 6 of the above mentioned embodiment 4 and explanation thereof will be omitted. In addition, a communication device according to the embodiment 5 is different from the device according to the embodiment 1 in FIG. 1 only in the internal configuration of the frequency shift circuit and configurations other than the above are the same as those in FIG. 1. In addition, the internal configuration of the complex multiplication circuit 15c is the same as that in FIG. 7. In the explanation of the embodiment 5, only configurations and operations which are different from those in the embodiments 1 to 4 will be described.

For example, although in the embodiment 4, the real part of the data exp(•) is set to "1" by the approximation, the data on the imaginary part is left in the exp table 14c-2. On the other hand, since the information in the exp table 14c-2 is information which is approximated with "1+angle", if the unit (radian) of the angle is the same as that used for internal representation of rotation angle information, the rotation angle information may be directly used as the information on the imaginary part of the data in the exp table 14c-2. Therefore, in the embodiment 5, the radian is used as the unit used for the internal representation of the rotation angle information to be calculated for every symbol. Specifically, an angle computing unit 11d includes, for example, a first adder for performing cyclic addition and a second adder that judges whether an output from the first adder exceeds $2\pi$ it to execute a predetermined adding process. The first adder executes a loop operation of adding a fixed value (angle) $2\pi\Delta\theta$ to fed-back rotation angle information for every symbol. When the output from the first adder does not exceed $2\pi$, the second adder directly outputs the output from the first adder. While when the output exceeds $2\pi$, the second adder outputs the output from the first adder by adding $-2\pi$ thereto. Owing to execution of the above mentioned processes, the angle computing unit 11d computes rotation angle information $2\pi\theta$ with an accuracy of 25 bits. As a result, since it may become possible to use the rotation angle information $2\pi\theta$ directly as information on the imaginary part of the data in the exp table 14c-2, it may become possible to eliminate the exp table 14c-2 itself in the embodiment 5. That is, a table look-up unit 13d only includes the exp table 14b-1. Incidentally, in the embodiment 5, the number of bits of the imaginary part $Q_2$ in FIG. 7 is reduced to 6 bits (corresponding to the number of bits of the imaginary part of the separate table number $\theta_2$).

As described above, in the embodiment 5, the radian is set as the unit used for internal representation of the rotation angle information which is calculated for every symbol. Since it may become possible to use the rotation angle information which is calculated for every symbol directly as the information on the imaginary part of the data in the exp table 14c-2 owing to the above mentioned configuration, the exp table 14c-2 itself may be eliminated and hence it may become possible to implement frequency shifting with a further smaller circuit scale.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A frequency shift circuit that shifts the frequency of an input signal using a rotor corresponding to a predetermined phase rotation amount, the frequency shift circuit comprising:
    a plurality of tables each of which stores complex data;
    a complex multiplication circuit that complex-multiplies the complex data stored in the plurality of tables and inputted to the complex multiplication circuit based on address information;
    a deletion circuit that generates a rotor corresponding to a phase rotation amount which is based on a result of the complex-multiplication; and
    a calculation circuit that calculates the address information for each of the plurality of tables such that $\exp(2\pi j\theta)$ is obtained as the result of the complex multiplication based on rotation angle information $\theta$.

2. The frequency shift circuit according to claim 1, wherein the address information includes table numbers,
    the plurality of tables include
    a first table that stores complex data corresponding to rotation angle information of each of first rotation angles in rotation angle information for one period which has been calculated with a predetermined accuracy, and
    a second table that stores complex data corresponding to rotation angle information of each of second rotation angles which are set more finely than the first rotation angles, and
    the calculation circuit calculates any one piece of the rotation angle information of each of the first rotation angles and any one piece of the rotation angle information of each of the second rotation angles in accordance with the rotation angle information $\theta$ as the table numbers.

3. The frequency shift circuit according to claim 2, wherein the calculation circuit calculates the table numbers by utilizing subtraction and residue calculation of the rotation angle information $\theta$.

4. The frequency shift circuit according to claim 2, wherein the calculation circuit generates the table numbers by extracting a digital value of a desired number of bits in order starting from a higher-order bit of a digital value corresponding to the rotation angle information $\theta$.

5. The frequency shift circuit according to claim 2, wherein the calculation circuit sets the real part of the complex data corresponding to the rotation angle information of each of the second rotation angles to 1 (one) by approximation.

6. The frequency shift circuit according to claim 5, wherein the calculation circuit deletes higher-order bits of successive 0s (zeros) in a digital value corresponding to the imaginary part of the complex data corresponding to the rotation angle information of each of the second rotation angles.

7. The frequency shift circuit according to claim 5, wherein
    the calculation circuit calculates rotation angle information which is expressed in angle by a circular method with a predetermined accuracy as the rotation angle information $\theta$ and uses the rotation angle information so expressed in angle by the circular method as the value of the imaginary part of an output from the second table, and
    the deletion circuit complex-multiplies complex data output from the first table and the rotation angle information which is expressed in angle by the circular method for the rotation angle information $\theta$ and generates the rotor based on a result of complex multiplication executed.

8. A communication device that receives a signal having two frequency bands using a single analog circuit and then separates it into respective signals using a digital circuit, the communication device comprising:
    an A/D converter that converts an analog signal output from the analog circuit to a digital signal;
    two frequency shift circuits that respectively perform frequency shifting on the A/D converted signal per signal having frequency bands to be separated; and
    two digital filters for the respective frequency shift circuits to extract the signal having the frequency bands to be separated from the frequency-shifted signal;
    wherein
    each of the frequency shift circuits includes
    a plurality of tables each of which stores complex data,
    a complex multiplication circuit that complex-multiplies the complex data stored in the plurality of tables and inputted to the complex multiplication circuit based on address information,
    a deletion circuit that generates a rotor corresponding to a phase rotation amount which is based on a result of the complex-multiplication, and
    a calculation circuit that calculates the address information for each of the plurality of tables such that $\exp(2\pi j\theta)$ is obtained as the result of complex multiplication based on rotation angle information $\theta$.

* * * * *